United States Patent
Yokoyama et al.

(10) Patent No.: US 8,854,158 B2
(45) Date of Patent: Oct. 7, 2014

(54) ELASTIC WAVE DEVICE AND METHOD FOR MANUFACTURING THE SAME

(75) Inventors: Tsuyoshi Yokoyama, Tokyo (JP); Shinji Taniguchi, Tokyo (JP); Masafumi Iwaki, Tokyo (JP); Motoaki Hara, Tokyo (JP); Takeshi Sakashita, Tokyo (JP); Tokihiro Nishihara, Tokyo (JP); Masanori Ueda, Tokyo (JP)

(73) Assignee: Taiyo Yuden Co., Ltd., Tokyo (JP)

( * ) Notice: Subject to any disclaimer, the term of this patent is extended or adjusted under 35 U.S.C. 154(b) by 587 days.

(21) Appl. No.: 13/127,215

(22) PCT Filed: Nov. 28, 2008

(86) PCT No.: PCT/JP2008/071714
§ 371 (c)(1),
(2), (4) Date: May 2, 2011

(87) PCT Pub. No.: WO2010/061479
PCT Pub. Date: Jun. 3, 2010

(65) Prior Publication Data
US 2011/0241800 A1    Oct. 6, 2011

(51) Int. Cl.
*H03H 9/54* (2006.01)
*H03H 3/04* (2006.01)
*H03H 9/56* (2006.01)
*H03H 9/17* (2006.01)

(52) U.S. Cl.
CPC ............. *H03H 9/173* (2013.01); *H03H 9/564* (2013.01); *H03H 9/568* (2013.01); *H03H 2003/0414* (2013.01); *H03H 2003/0428* (2013.01); *H03H 3/04* (2013.01)
USPC .......... 333/189; 333/187; 310/312; 29/25.35; 29/594

(58) Field of Classification Search
USPC ........... 333/187–189; 310/312; 29/25.35, 594
See application file for complete search history.

(56) References Cited

U.S. PATENT DOCUMENTS 6,051,907 A * 4/2000 Ylilammi ..................... 310/312
6,307,447 B1 * 10/2001 Barber et al. ................. 333/189
(Continued)

FOREIGN PATENT DOCUMENTS

JP       7-106892    *  4/1995
JP       2002-299979 A   10/2002
(Continued)

OTHER PUBLICATIONS

Li-Peng Wang et al.; "Method of Fabricating Multiple-Frequency Film Bulk Acoustic Resonators in a Single Chip"; 2006 IEEE International Frequency Control Symposium and Exposition, Jun. 2006, pp. 793-796 and one IEEE abstract page.*

(Continued)

*Primary Examiner* — Barbara Summons
(74) *Attorney, Agent, or Firm* — Chen Yoshimura LLP

(57) ABSTRACT

A method of manufacturing an elastic wave device is provided with a lamination step of forming, on a substrate (1), a plurality of elastic wave devices, each of which includes a lower electrode (2), a piezoelectric film (3), and an upper electrode (4); a measuring step for measuring the operation frequency distribution of the elastic wave devices on the substrate (1); and an adjusting step for forming an adjusting region, in which the thickness of the elastic wave device is different from the thicknesses of other portions in a resonance portion of each elastic wave device, corresponding with the distribution of the operation frequencies. The adjusting region is formed so that the size of the area of the adjusting region of the resonator portion of each elastic wave device is different in accordance with the operation frequency distribution that is measured. Thus, the frequency characteristics of the elastic wave devices are easily adjusted by a small number of steps.

16 Claims, 15 Drawing Sheets

Difference from the reference frequency = 8MHz
Coverage rate = 12%

(56) References Cited

U.S. PATENT DOCUMENTS

| | | | |
|---|---|---|---|
| 6,339,276 B1* | 1/2002 | Barber et al. | 310/312 |
| 6,407,649 B1* | 6/2002 | Tikka et al. | 333/133 |
| 6,441,702 B1 | 8/2002 | Ella et al. | |
| 6,604,266 B1* | 8/2003 | Tajima et al. | 29/25.35 |
| 6,657,363 B1 | 12/2003 | Aigner | 310/324 |
| 7,145,417 B2* | 12/2006 | Kimachi et al. | 333/189 |
| 7,489,063 B2* | 2/2009 | Isobe et al. | 310/312 |
| 7,675,389 B2* | 3/2010 | Yamakawa et al. | 333/133 |
| 2002/0121498 A1 | 9/2002 | Bradley et al. | |
| 2002/0121840 A1 | 9/2002 | Larson, III et al. | |
| 2002/0121945 A1 | 9/2002 | Ruby et al. | |
| 2002/0123177 A1 | 9/2002 | Ruby et al. | |
| 2004/0017130 A1* | 1/2004 | Wang et al. | 310/311 |
| 2005/0218754 A1 | 10/2005 | Yokoyama et al. | |
| 2007/0139140 A1* | 6/2007 | Rao et al. | 333/188 |
| 2008/0169885 A1 | 7/2008 | Ueda et al. | |
| 2008/0290969 A1* | 11/2008 | Yamakawa et al. | 333/197 |

FOREIGN PATENT DOCUMENTS

| | | |
|---|---|---|
| JP | 2002-299980 A | 10/2002 |
| JP | 2002-335141 A | 11/2002 |
| JP | 2002-344270 A | 11/2002 |
| JP | 2003-50584 A | 2/2003 |
| JP | 2005-286945 A | 10/2005 |
| JP | 2008-172494 A | 7/2008 |
| JP | 2008-244653 A | 10/2008 |

OTHER PUBLICATIONS

International Search Report (ISR) issued in PCT/JP2008/071714 (International application) mailed in Feb. 2009 for Examiner consideration, citing U.S. Patent No. 1, U.S. Patent Application Publication No. 1, and Foreign Patent Document Nos. 6-8 listed above.
Chinese Office Action dated Nov. 15, 2013, in a counterpart Chinese patent application No. 200880131170.6. (Partial translation of the Office Action is attached as a concise explanation of relevance.).

* cited by examiner

Region 4

16MHz
Difference from the reference frequency = 24%

(a)

(b)

(a)

(b)

ELASTIC WAVE DEVICE AND METHOD FOR MANUFACTURING THE SAME

TECHNICAL FIELD

The present invention relates to an elastic wave device such as, for example, a piezoelectric film resonator, and a method of manufacturing thereof.

BACKGROUND ART

Demand for small and light-weight piezoelectric film resonators and filters configured with such devices is growing because of a rapid spread of wireless devices, a key example of which is a mobile phone. While dielectric filters and surface acoustic wave (SAW) filters have mainly been in use up to now, filters made up of a piezoelectric thin film resonator, which is a device offering good characteristics especially at high frequencies and enabling small form factors and monolithic integration, have recently been attracting interest.

FBARs (film bulk acoustic resonators) and SMRs (solidly mounted resonators) are included among such piezoelectric thin film resonators. An FBAR includes an upper electrode, piezoelectric film, and lower electrode on a substrate. A cavity is opened underneath the lower electrode at a portion where the upper electrode and the lower electrode face opposite each other. Here, the cavity is created by wet etching a sacrificial layer formed on the surface of the substrate, on which the lower electrode is placed, or by wet etching or dry etching, for example, the substrate from the back side. In an SMR, in lieu of the aforementioned cavity, an acoustic reflection film is created with films having high acoustic impedance and low acoustic impedance and laminated one after next with the film thicknesses of $\lambda/4$, where $\lambda$ is an elastic wave wavelength.

When a high frequency voltage, which is an electrical signal, is applied between the upper electrode and the lower electrode of the piezoelectric thin film resonator, an elastic wave is generated as a result of a reverse piezoelectric effect in the piezoelectric film that is sandwiched between the upper electrode and the lower electrode. Furthermore, a strain created by the elastic waves is converted into an electrical signal by the piezoelectric effect. Because such elastic waves are totally reflected at the surfaces where the upper electrode film and the lower electrode film, respectively, are in contact with the air, they become vertically oscillating waves with the main direction of displacement along the thickness direction of the piezoelectric film. It is possible to obtain an resonator (or a filter formed with a plurality of resonators that are connected) having prescribed frequency characteristics, by taking advantage of such resonance phenomenon.

For example, an FBAR has a resonance at a frequency at which H, which is a total film thickness of the laminated structural portion made up mainly of the upper electrode film, piezoelectric film, and lower electrode film, formed over the cavity, equals an integral multiple (n times) of a half of the elastic wave wavelength $\lambda$ (wavelength/2) ($H=n\lambda/2$). When the elastic wave propagation speed, which is determined by the piezoelectric film material, is V, the resonance frequency F is given by $nV/(2H)$. Therefore, the resonance frequency F can be controlled by the total film thickness H of the laminated structure.

In general, such a piezoelectric thin film resonator and a device such as a filter formed with a plurality of resonators that are connected are manufactured as follows. Firstly, a large number of the aforementioned devices is formed with a single process on a wafer, and the wafer is ultimately diced, so that the individual prescribed chips, which include the aforementioned device, are obtained.

As described above, the resonance frequency (or the center frequency in the case of a filter) of a piezoelectric thin film resonator or a filter using the resonator is determined by the total film thickness of the laminated structure. For this reason, the resonance frequency (or in the case of the filter, the center frequency) shifts with the film thicknesses of the lower electrode film, piezoelectric film, and upper electrode film, which are the main films that make up the piezoelectric thin film resonator. For this reason, the resonance frequencies (or the center frequencies) of the piezoelectric thin film resonator formed in large numbers on a wafer and the filters formed by a plurality of connected such resonators vary in accordance with the distribution of the aforementioned film thicknesses across the wafer surface.

Because this variability in the resonance frequencies (or the center frequencies) leads to lower device yields, it is necessary to adjust the frequency variability across the wafer surface. Conventionally, adjustments have been made with a reduction in the film thicknesses of the lower electrode film, piezoelectric film, and the upper electrode film, which are the main component films, with etching (to shift the frequencies to higher frequencies), or with an increase in the film thicknesses with an addition to the upper electrode (to shift the frequencies to lower frequencies). Or a method is utilized in which a frequency adjusting film is newly formed in addition to the aforementioned main component films, and the adjustment is made with an increase or a decrease in the thickness of this frequency adjusting film (see, for example, Patent Documents 1 through 5 referenced below).

Patent Document 1: Japanese Patent Application Laid Open Publication No. 2002-299979
Patent Document 2: Japanese Patent Application Laid Open Publication No. 2002-299980
Patent Document 3: Japanese Patent Application Laid Open Publication No. 2002-335141
Patent Document 4: Japanese Patent Application Laid Open Publication No. 2002-344270
Patent Document 5: Japanese Patent Application Laid Open Publication No. 2005-286945

SUMMARY OF THE INVENTION

Problems to be Solved by the Invention

However, with a single frequency adjusting step (increasing or decreasing the film thickness), frequencies only at a single portion of a wafer can be shifted, when the frequency distribution, which results from a distribution of film thicknesses across the wafer surface, is adjusted. Therefore, in order to achieve high yields across the wafer surface, it is necessary to conduct a plurality of frequency adjustments across the wafer. It is necessary, for this reason, to conduct a plurality of frequency processes, which leads to a higher process complexity and higher device cost.

The present invention has been made in consideration of the aforementioned issues. An object of the present invention is to provide a manufacturing method and an elastic wave device with which it is possible to make the frequency adjustments in a simplified manner for elastic wave devices, which are, for example, the piezoelectric thin film resonators formed in plurality on a wafer or filters formed with a plurality of connected such resonators.

Means for Solving the Problems

A method of manufacturing disclosed in the present application includes a laminating step of forming on a substrate a plurality of elastic wave devices including a lower electrode, a piezoelectric film formed over the aforementioned lower electrode, and an upper electrode formed at a position facing the lower electrode through the aforementioned piezoelectric film therebetween; a measuring step of measuring the distribution of operating frequencies of the plurality of elastic wave devices on the aforementioned substrate, a region where the aforementioned lower electrode and the aforementioned upper electrode face each other through the piezoelectric film therebetween functioning as a resonance portion; and an adjusting step of forming, at the aforementioned resonance portion of each elastic wave device, an adjusting region, in which the thickness of the elastic wave device differs from other portions, in accordance with the distribution of the operating frequencies. The adjusting region is formed in the adjusting step such that the size of the area of the adjusting step in the resonance portion of each of the elastic wave devices varies in accordance with the measured distribution of the operating frequencies.

With the aforementioned manufacturing method, at the resonance portion of each elastic wave device, an adjusting region, which has a different upper surface layer thickness from the other portions, is formed with the size of an area in accordance with the distribution of operating frequencies across the substrate surface. In other words, the distribution and the distribution of volume of the elastic wave energy at the respective resonance portions are adjusted by way of the area of the adjusting region at the resonance portions in the respective elastic wave devices. The amount of this adjustment is in accordance with the operating frequency distribution across the substrate surface. For this reason, it is possible to adjust the operating frequency of each elastic wave device with, for example, a single patterning process (for example, a single film deposition and/or etching). As a result, it is possible to adjust the frequency characteristics of a plurality of elastic wave devices on the substrate with fewer process steps, as compared with cases where adjusting layers of varying thicknesses are added to a plurality of locations within a substrate, for example.

Effects of the Invention

According to the disclosure of the present specification, it is possible to adjust the frequency characteristics of a plurality of elastic wave devices formed on a substrate in a simplified manner.

DETAILED DESCRIPTION OF EMBODIMENTS

Figure 1A:
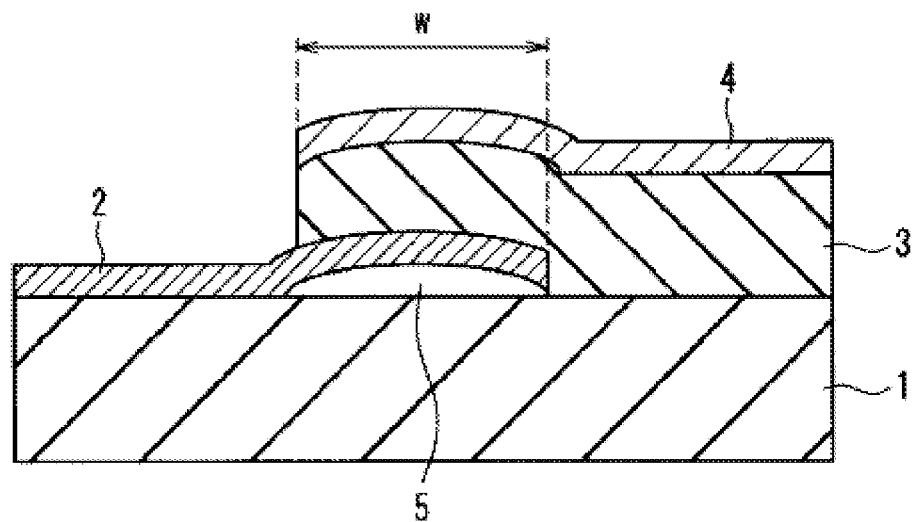
FIG. 1A is a drawing showing an example of a cross-section of an FBAR formed on a wafer.

In an embodiment of the present invention, the aforementioned adjusting region may be formed by forming an adjusting film in at least a portion on the aforementioned upper electrode in the aforementioned adjusting step.

As a result, it is possible to adjust the operating frequencies of a plurality of elastic wave devices on the substrate in a single step for forming the adjusting film.

In an embodiment of the present invention, the operating frequencies of the plurality of elastic wave devices on the aforementioned substrate may be measured in the aforementioned measuring step, and the size of the area of the aforementioned adjusting region in each of the elastic wave devices may be determined based on a difference between the measured respective operating frequency for the aforementioned plurality of elastic wave devices and a predetermined reference frequency in the aforementioned adjusting step.

As a result, it is possible to make the operating frequencies of the plurality of elastic wave devices on the substrate uniform and close to the reference frequency. Here, the frequency that represents the frequency characteristics of the resonator portion when the elastic wave device is in operation can be measured as the operating frequency. For example, the resonance frequency or anti-resonance frequency may be measured when the elastic wave device is an FBAR, and the center frequency may be measured when the elastic wave device is a filter.

In an embodiment of the present invention, the aforementioned adjusting region may be formed by forming an adjusting film in at least a portion on the aforementioned upper electrode, and the aforementioned adjusting film may be formed with the same thickness among the plurality of elastic wave devices in the aforementioned adjusting step.

As a result, the adjusting step is further simplified, because the operating frequencies are adjusted with the sizes of the areas alone, while the thickness of the adjusting film is made uniform.

In an embodiment of the present invention, the aforementioned adjusting region may be formed with an adjusting film having a hole-shaped pattern formed on the aforementioned upper electrode or may be formed with an adjusting film having an island-shaped pattern formed on the aforementioned upper electrode.

In an embodiment of the present invention, the aforementioned adjusting region may be formed by forming an adjusting film on at least a portion of the aforementioned upper electrode in the aforementioned adjusting step, and the combination of the material for the aforementioned adjusting film and the material for a layer beneath the aforementioned adjusting film may be a combination of such materials exhibiting different reactions to a prescribed etching. As a result, it is possible to prevent the film underneath the adjusting film from becoming damaged during an etching for forming the adjusting film. It may be said that the combination of materials exhibiting different reactions to the prescribed etching is a combination of materials having etch selectivity.

In an embodiment of the present invention, a plurality of chips are formed in the aforementioned lamination step by forming a plurality of elastic wave devices on the aforementioned substrate, and the aforementioned adjusting regions are formed in such a way that the surface area of the aforementioned adjusting region in the aforementioned resonance portion in the plurality of elastic wave devices is different for each of the aforementioned plurality of chips in accordance with the distribution of the aforementioned measured operating frequencies in the aforementioned adjusting step. As a result, the operating frequency is adjusted for each chip. For this reason, chips having a small frequency characteristic variation on the same substrate can be obtained.

An elastic wave device of an embodiment of the present invention is a plurality of elastic wave devices including a substrate, a lower electrode formed on the aforementioned substrate, a piezoelectric film formed on the aforementioned lower electrode, and an upper electrode formed at a position facing opposite the aforementioned lower electrode through the aforementioned piezoelectric film therebetween. In each elastic wave device, an adjusting region in which a thickness of the elastic wave device differs from other portions is formed in the resonance portion, in which the lower electrode faces opposite the aforementioned upper electrode through the aforementioned piezoelectric therebetween, and the sizes of the areas of the aforementioned adjusting regions in the aforementioned resonance portions are different among the plurality of elastic wave devices on the aforementioned substrate.

Accordingly, by making the sizes of the surface areas of the adjusting regions, in which the thickness of the elastic wave device differs from the other portions, in the resonance portions different among the plurality of elastic wave devices on the substrate, it is possible to adjust the operating frequency distribution among a plurality of elastic wave devices. In other words, the distribution of volumes and the distribution of elastic wave energy in the resonance portions may be adjusted by changing the surface areas of the adjusting regions. For this reason, it is possible to provide elastic wave devices, the frequency characteristics of which are adjusted using a smaller number of steps. As a result, a plurality of elastic wave devices having a small variation in frequency characteristics is formed on the same substrate.

In an embodiment of the present invention, a plurality of chips are formed with a plurality of elastic wave devices on the aforementioned substrate, and the sizes of the areas of the aforementioned adjusting regions in the aforementioned resonance portions of the plurality of elastic wave devices may be configured to be different among the chips.

In an embodiment of the present invention, the aforementioned adjusting region is formed by an adjusting film formed at least in a portion on the aforementioned upper electrode, and the aforementioned adjusting film may be of the same thickness among a plurality of elastic wave devices.

As a result, a plurality of elastic wave devices are provided with a uniform adjusting film thickness, while the operating frequencies are adjusted with the sizes of the areas alone. For this reason, a plurality of elastic wave devices having a small variation in frequency characteristics is formed on the same substrate with a small number of steps.

Embodiments of the present invention are set forth in specific descriptions below with reference to the drawings.

(Embodiments)

A first embodiment relates to a method of manufacturing a plurality of elastic wave devices on the same substrate. A description is set forth here for cases where a plurality of filters, each formed by connecting a plurality of piezoelectric thin film resonators (referred to as "FBAR" hereafter) are formed on a single wafer (an example of a substrate). Here, the FBAR and filter are examples of the elastic wave devices. The manufacturing process for the elastic wave devices in the present embodiment includes three process steps, which are roughly categorized into a laminating step, a measuring step, and a adjusting step.

The laminating step is a step to form a plurality of filters by laminating lower electrodes, piezoelectric films, and upper electrodes to form the FBARs. The measuring step is a step to measure the distribution of the resonance frequencies of the FBARs across a wafer. The adjusting step is a step to reduce the variation in resonance frequencies among the FBARs on the wafer by forming an adjusting region having a different thickness from the other portions in a resonance portion of the FBAR in each filter.

Figure 1B:
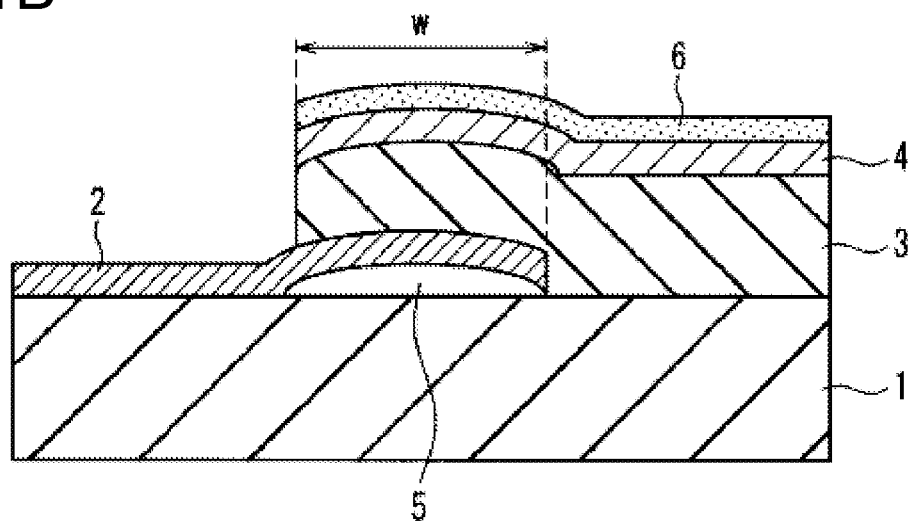
FIG. 1B is a drawing showing an example of a cross-section of an FBAR formed on a wafer.

FIG. 1A and FIG. 1B are diagrams showing an example of the cross-sections of the FBAR formed on the wafer in the laminating step. FIG. 1A shows a cross-section of an FBAR, which is to become a serial resonator of the filter, while FIG. 1B shows a cross-section of an FBAR, which is to become a parallel resonator of the filter. As shown in FIG. 1A and FIG. 1B, the FBAR includes a lower electrode 2 formed on a wafer 1, a piezoelectric film 3 formed on the lower electrode 2, and an upper electrode 4 facing opposite the lower electrode 2 through the piezoelectric film 3 therebetween. The FBAR shown in FIG. 1B, which is to become a parallel resonator, further includes a mass load film 6 on the upper electrode 4. A region W, in which the upper electrode 4 and the lower electrode 2 face opposite each other through the piezoelectric film therebetween, is the resonance portion, and a cavity 5 is opened underneath the resonance portion.

Figure 2:
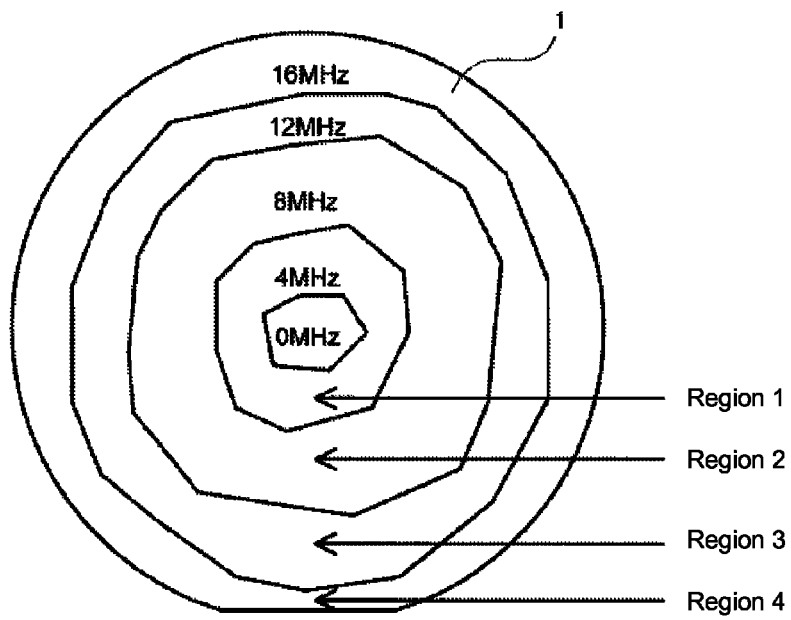
FIG. 2 is a drawing showing an example of a distribution of frequencies measured across the wafer surface in the present embodiment.

The FBARs shown in FIG. 1A and FIG. 1B are formed in plurality on the wafer. The distribution of the resonance frequencies of the FBARs on the wafer 1 is measured in the measuring step. FIG. 2 shows an example of a frequency distribution across the wafer 1, as measured in the measuring step. The example shown in FIG. 2 shows regions, in which the difference between the FBAR resonance frequencies and the prescribed reference frequency is 0 MHz, 4 MHz, 8 MHz, 12 MHz, and 16 MHz, respectively. The regions in which the difference between the FBAR resonance frequency and the prescribed reference frequency is 4 MHz, 8 MHz, 12 MHz, and 16 MHz, respectively, are region 1, region 2, region 3, and region 4. Here, the reference frequency is a prescribed resonance frequency, which has been set in advance.

In the adjusting step, an adjusting film is formed in a portion on the upper electrode in at least some of the FBAR on the wafer 1. Here, the adjusting film, for example, is formed as a layer making up a portion of the upper electrode 4. The size of the area of the adjusting film formed in respective FBARs is adjusted in accordance with the frequency distribution such as that shown in FIG. 2.

The size of the area of the adjusting film in each FBAR may, for example, be expressed as an adjusting film coverage rate with respect to a region W (resonance portion) in which the lower electrode 2 and the upper electrode 4 face opposite each other. For example, when the adjusting film is formed of a plurality of standalone patterns, the ratio of the sum of the sizes of areas of these standalone patterns relative to the size of the area of the resonance portion is the coverage rate.

The thickness of the adjusting films in the FBARs preferably is constant. Furthermore, the adjusting films are formed in such a way that the coverage rates of the adjusting films in the resonance portions have a distribution that matches the across-the-wafer distribution of the frequencies measured in the measuring step. As a result, it is possible to adjust the sizes of areas of the adjusting films, or the amount of frequency adjustments, in accordance with the across-the-wafer distribution of the frequencies. For example, it is possible to make the thickness of the adjusting films uniform across the entire wafer, make the coverage rate of the adjusting films with respect to the resonance portions small in the FBARs at the locations where the amounts of frequency adjustments (the difference from the reference frequency) are small, and make the coverage rates large for the FBARs at the locations where the amounts of frequency adjustments are large. As a result, it is possible to adjust the frequencies of the elastic wave devices, having different thickness profiles across a wafer surface, by the sizes of areas of the adjusting film having a uniform thickness.

Figure 3A:
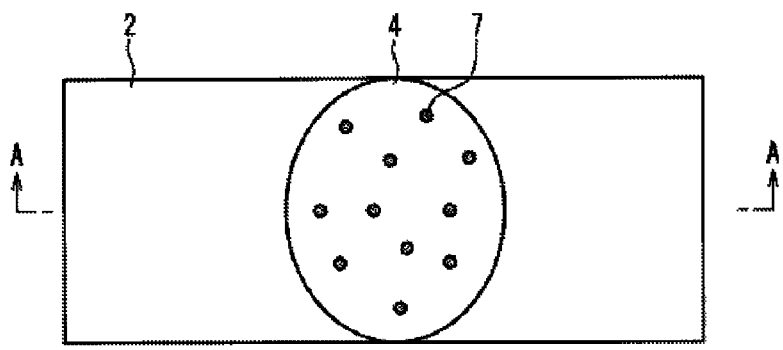
FIG. 3A is a top view drawing showing an example of the structure of the FBAR in which an adjusting film is formed.
Figure 3B:
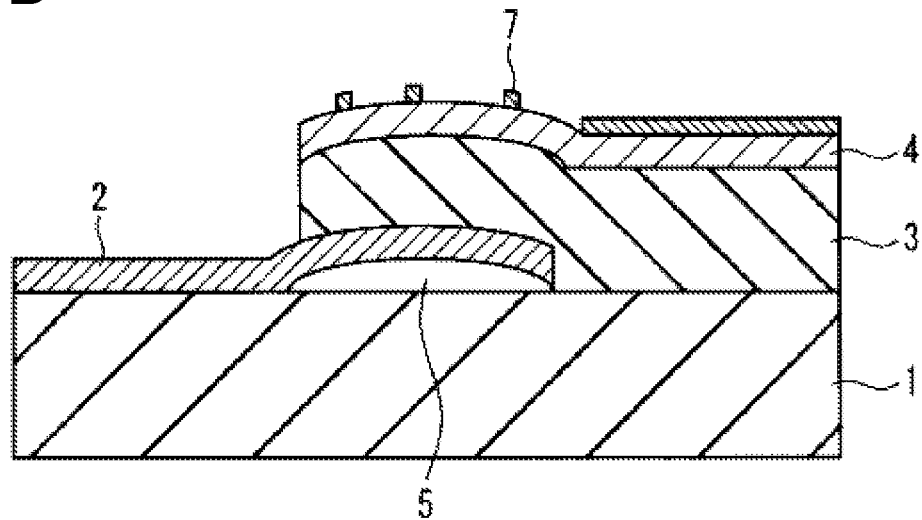
FIG. 3B is a cross-sectional diagram along the line A-A in the FBAR shown in FIG. 3B.
Figure 3C:
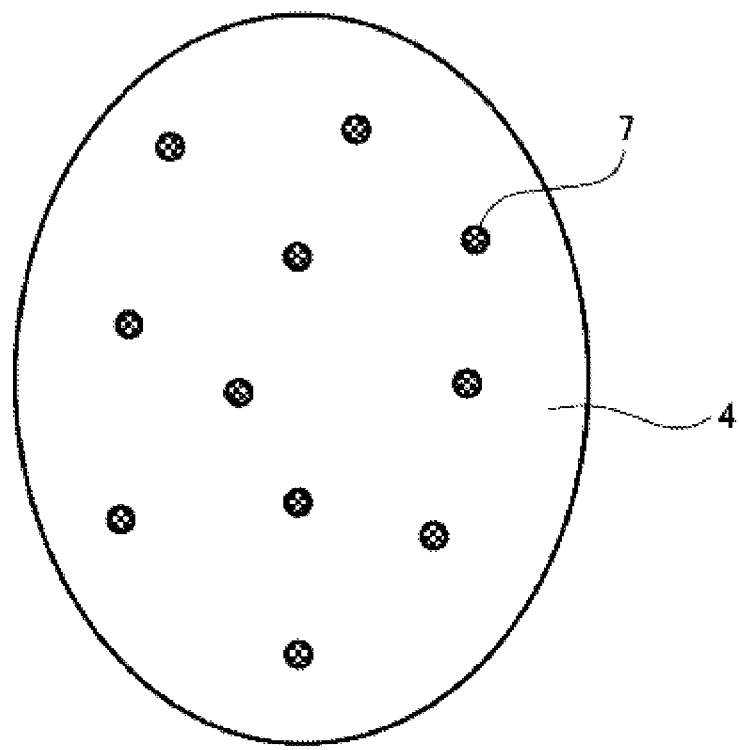
FIG. 3C is a magnified diagram of the resonance portion of the FBAR shown in FIG. 3A.

FIG. 3A, FIG. 3B, and FIG. 3C are drawings showing an example of the structure of the FBAR on which the adjusting film is formed. FIG. 3A is a top view drawing of the FBAR on which the adjusting film is formed, FIG. 3B is a cross-sectional drawing of this FBAR, and FIG. 3C is a magnified drawing of the resonance portion of the FBAR shown in FIG. 3A. The FBAR shown in FIG. 3A through FIG. 3C is an example of the FBAR formed in the region 1 shown in FIG. 2. In other words, it is an example of the adjusting film formed for the FBAR having a resonance frequency which is approximately 4 MHz higher than the reference frequency.

In the example shown in FIG. 3A through FIG. 3C, an adjusting film 7 is formed on the upper electrode 4. Here, as an example, the adjusting film 7 is patterned in such a way that the size of the area of the adjusting film 7 is 6% of the overall size of the area of the resonance portion, in which the lower electrode 2 and the upper electrode 4 face each other.

Here, the island-shaped standalone patterns of the adjusting film 7 are placed in such a way as to be dispersed randomly and essentially across the entire resonance portion. Because this random layout of the island-shaped standalone patterns suppresses spurious modes, a degradation in the characteristics is avoided. Here, the pattern layout is not limited to this. For example, the adjusting film 7 pattern may be holes randomly dispersed across the entire resonance portion. When the standalone patterns or holes are thus dispersed across the entire resonance region in these patterns, the degradation in characteristics can be avoided. The dispersion should preferably be random in consideration of the characteristic degradation.

In the region 1, the resonance frequency of the FBAR is off by approximately 4 MHz from the prescribed reference frequency. In the example shown in FIG. 3A through FIG. 3C, the aim for having the area of the adjusting film occupy 6% of the resonance portion of the FBAR in the region 1 is to shift the resonance frequency of the FBAR in the region 1 only by approximately 4 MHz. The resonance frequency of the FBAR in the region 1 is thus made closer to the reference frequency.

Figure 4:
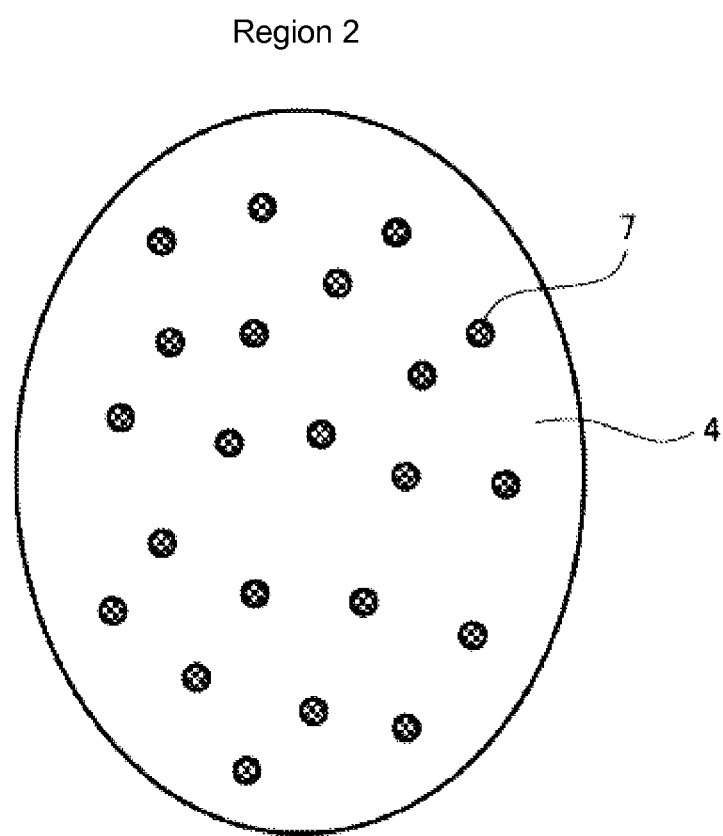
FIG. 4 is a drawing showing an example of patterning of the adjusting film in the region 2 shown in FIG. 2.
Figure 5:
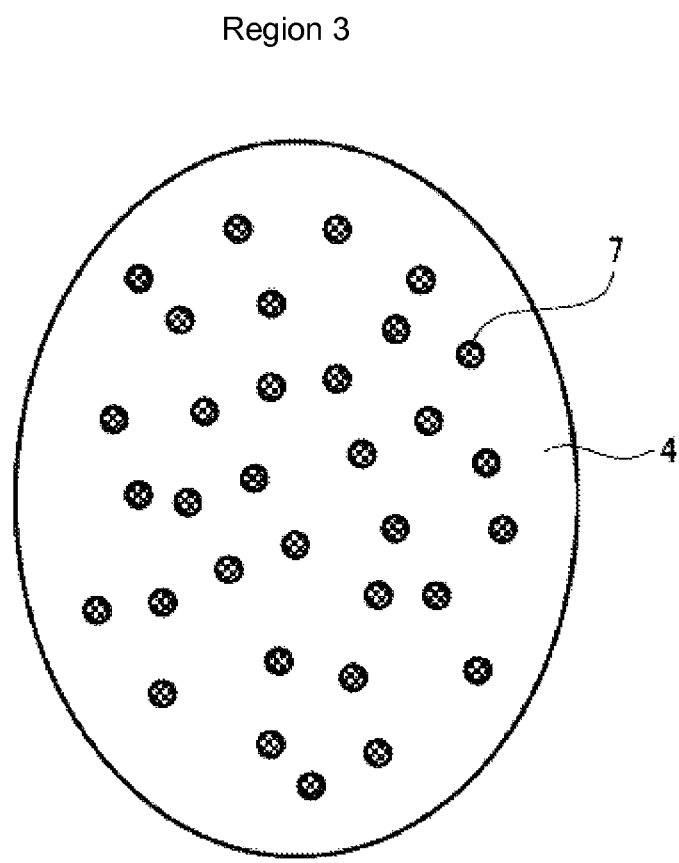
FIG. 5 is a drawing showing an example of patterning of the adjusting film in the region 3 shown in FIG. 2.
Figure 6:
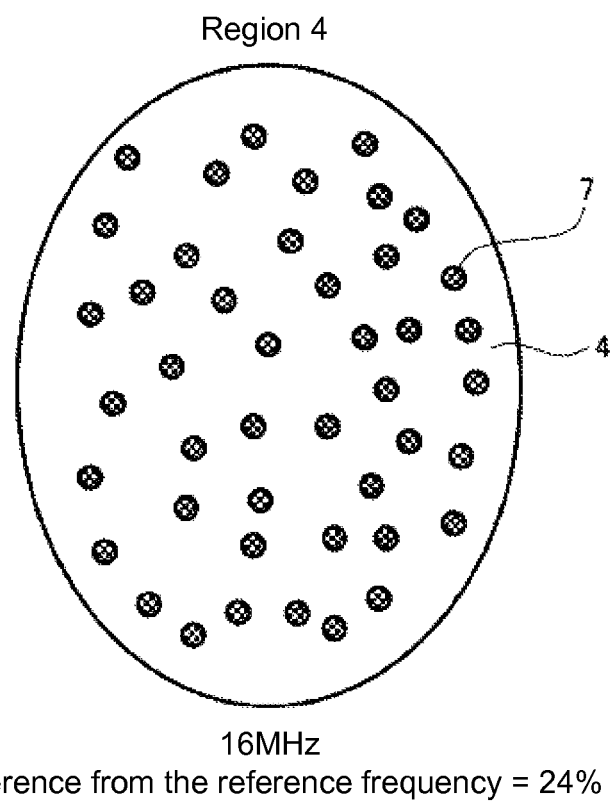
FIG. 6 is a drawing showing an example of patterning of the adjusting film in the region 4 shown in FIG. 2.

Examples of patterning of the adjusting film in the resonance portion of the FBAR are shown for the region 2 in FIG. 4, region 3 in FIG. 5, and region 4 in FIG. 6, respectively. The example in FIG. 4 shows a pattern in which the size of the area of the adjusting film 7 is (coverage rate) 12% of the resonance portion in the region 2. Coverage rates are 18% and 24%, respectively, in the regions 3 and 4, as shown in FIG. 5 and FIG. 6. Here, the size of the area occupied by the adjusting film in the resonance portion is 0% in a region in which the difference between the resonance frequency of the FBAR and the reference frequency is approximately 0 MHz. In other words, no adjusting film needs to be formed.

Accordingly, it is possible to decrease the area ratio of the adjusting film at locations where the amount of frequency adjustment is small, and to increase the area ratio of the adjusting film at locations where the amount of frequency adjustment is large. As a result, it is possible to conduct different frequency adjustment for each FBAR in a single etching step on a wafer that has a variation in the resonance frequency among the respective FBARs. Therefore, it is possible to improve on the variability of resonance frequencies of a plurality of FBARs formed on the wafer.

Figure 7:
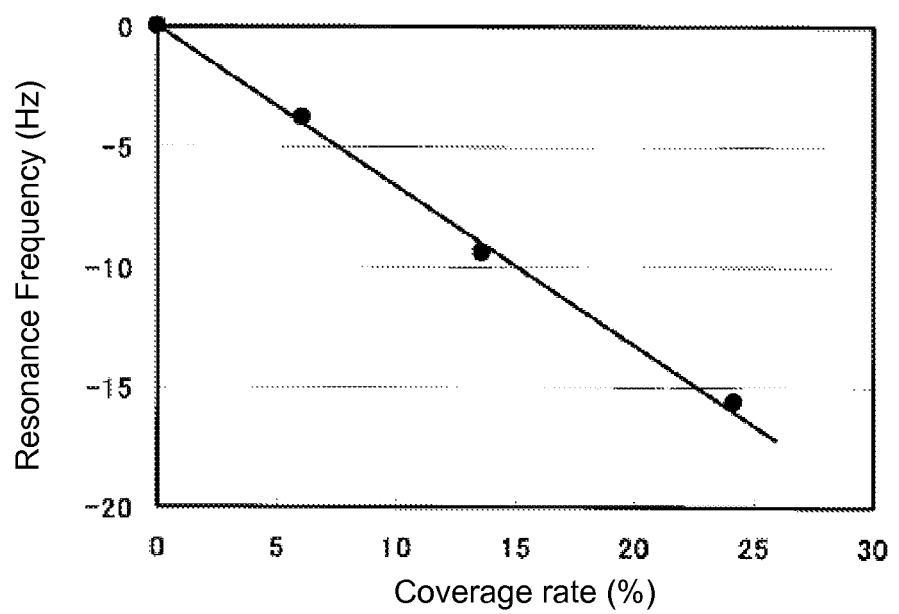
FIG. 7 is a graph showing a relationship between the adjusting film coverage rates and resonance frequencies.

FIG. 7 is a graph showing a relationship between the adjusting film coverage rates and the FBAR resonance frequencies. This graph shows the FBAR resonance frequencies for the various coverage rates of an adjusting film having a thickness of 100 nm. It is understood from this graph that the resonance frequency can be adjusted by making the thickness of the adjusting film constant and by adjusting the size of the area of the adjusting film relative to the resonance portion. In other words, it can be seen that the frequency characteristics of the elastic wave devices (FBARs) across the wafer can be adjusted, when the sizes of the area occupied by the adjusting film relative to the resonance portion are adjusted by the amounts proportional to the magnitudes of the shifts from the prescribed resonance frequency (reference frequency).

Here, the relationship between the size of the area occupied by the adjusting film in the resonance portion and the magnitude of the shift (difference) between the resonance frequency and the reference frequency is not limited to a proportional relationship such as those shown. The aforementioned relationship can be expressed, for example, with a function obtained empirically. Here, the coverage rate of the adjusting film in each region may be obtained by, for example, a computation run on a computer using a function showing a relationship between the coverage rate and the difference between the FBAR resonance frequency and the reference frequency. Or, data correlating the coverage rates and the values of the differences between the resonance frequencies and the reference frequency may be stored in advance in a data storage medium of a computer, and the coverage rate in each region may be determined using this data.

The size of the area covered by the adjusting film may be varied by each resonator, or by each filter across a single wafer, or by each chip on the wafer. In other words, while a case in which an elastic wave device as the unit of adjustment is a single FBAR is shown here for simplicity, the elastic wave device that becomes the unit of adjustment may be a filter having a plurality of FBARs or may be a chip having a filter, FBARs or the like. The adjustment can be conducted in other units that are suited for given purposes.

Other Examples of the Adjusting Film Patterns

Figure 8A:
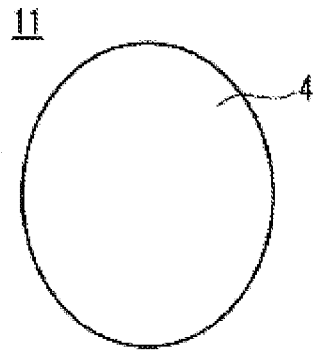
FIG. 8A is a drawing showing an example of other adjusting film patterns at the resonance portion.
Figure 8B:
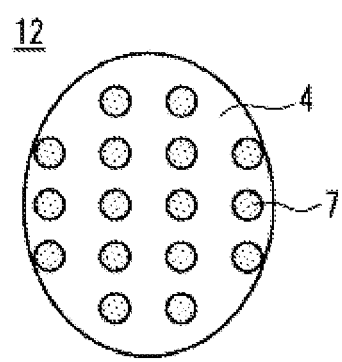
FIG. 8B is a drawing showing an example of other adjusting film patterns at the resonance portion.
Figure 8C:
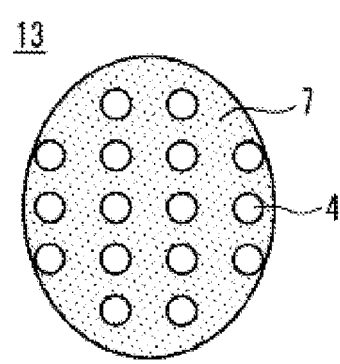
FIG. 8C is a drawing showing an example of other adjusting film patterns at the resonance portion.
Figure 8D:
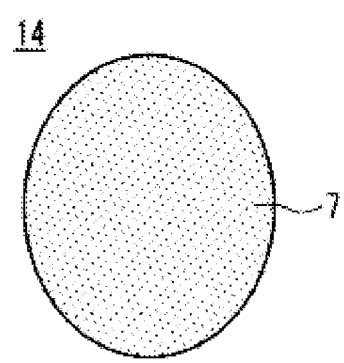
FIG. 8D is a drawing showing an example of other adjusting film patterns at the resonance portion.
Figure 9:
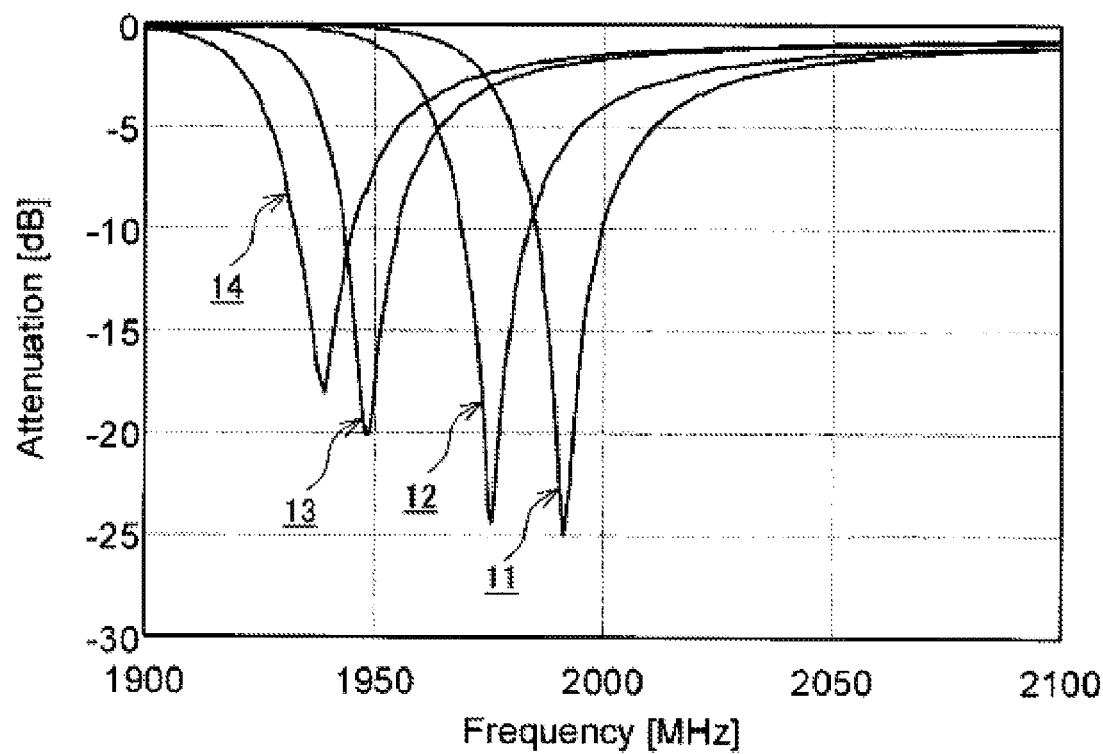
FIG. 9 is a graph showing respective frequency characteristics of the FBARs in which adjusting films of the patterns shown in FIG. 8A through FIG. 8D are formed.

FIG. 8A through FIG. 8D are diagrams showing other examples of the adjusting film patterns in the resonance portions. The resonance portion 11 shown in FIG. 8A is an example in which the adjusting film coverage rate is 0%, or there is no adjusting film formed. The resonance portion 12 shown in FIG. 8B is an example in which the island-shaped (dot shaped) standalone patterns are laid out in an orderly pattern. The resonance portion 13 shown in FIG. 8C is an example in which holes are laid out in an orderly pattern in the adjusting film 7. The resonance portion 14 shown in FIG. 8D is an example in which the coverage rate of the adjusting film 7 is at 100%. FIG. 9 is a graph showing the respective frequency characteristics of FBARs 11 through 14 in which the adjusting films having the patterns shown in FIG. A through FIG. D are formed. It is understood from the frequency characteristics of the FBARs 11 through 14 shown in the graph in FIG. 9 that the resonance frequency changes as the coverage rate of the adjusting film 7 changes.

Details on the Manufacturing Process

Next, a process for manufacturing a plurality of filters, including the FBARs with the serial resonators and the FBARs with the parallel resonators, on the wafer 1 will be set forth in detail. FIG. 10(a) through FIG. 10(e) are drawings showing the respective manufacturing processes for the serial resonator and for the parallel resonator formed on the wafer 1. The serial resonator is shown on the left side, while the parallel resonator is shown on the right side in FIG. 10(a) through FIG. 10(e). The serial resonator and the parallel resonator are formed on the same wafer 1.

Figure 10:
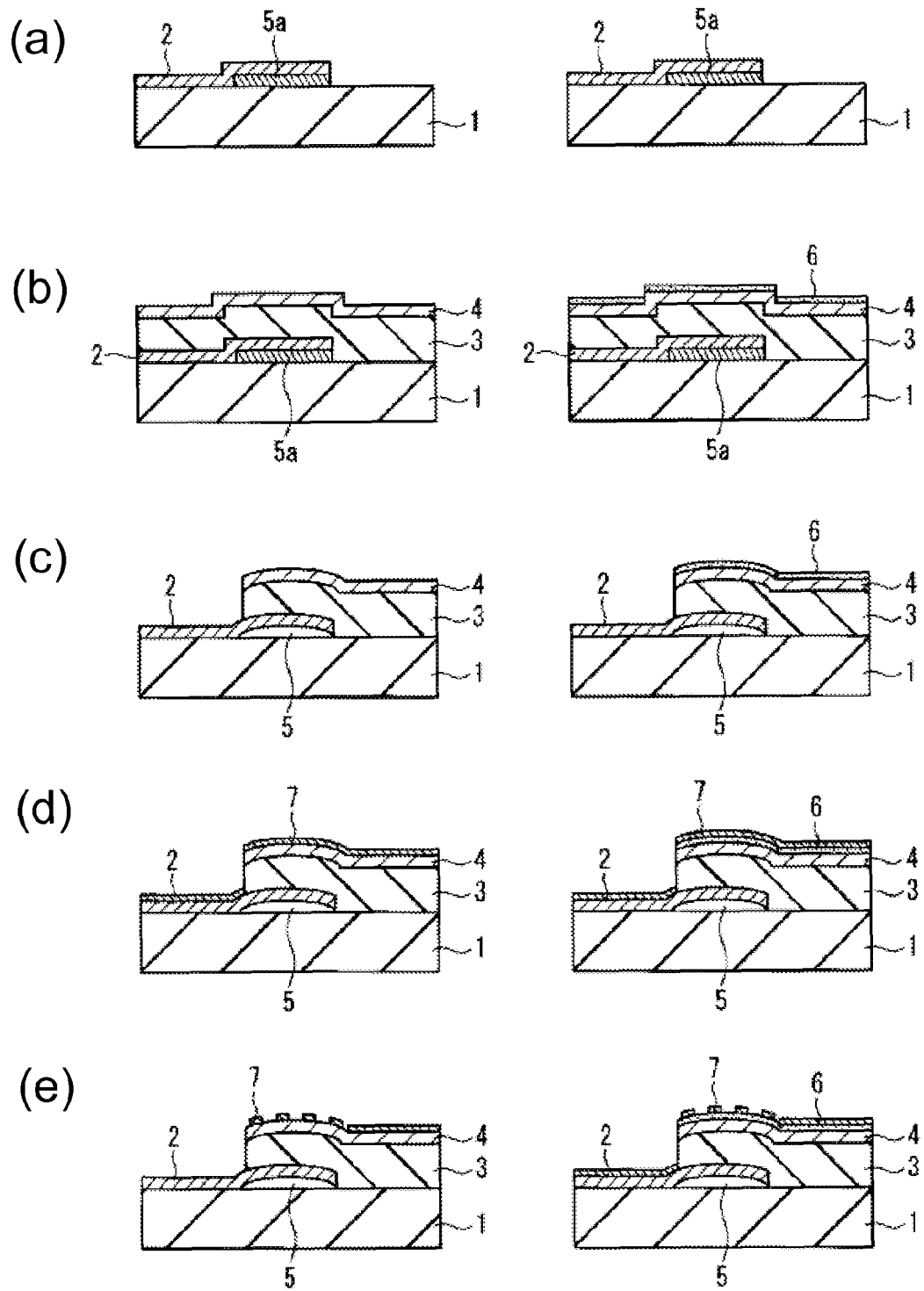
FIGS. 10(a)-10(e) are drawings showing the manufacturing processes, respectively, of the serial resonator and parallel resonator formed on the wafer 1.

As shown in FIG. 10(a), a sacrificial layer 5a and the lower electrode 2 are first formed on the wafer 1 (substrate). The sacrificial layer 5a and the lower electrode 2 are formed by, for example, vapor deposition or by sputtering, and are then patterned into prescribed shapes by photolithography. MgO, ZnO, Ge, Ti, or Cu, for example, may be used for the sacrificial layer 5a.

Next, as shown in FIG. 10(b), a piezoelectric film 3 and an upper electrode 4 are formed by, for example, sputtering, over the entire wafer 1 in such a way as to cover the sacrificial layer 5a and the lower electrode 2. As a result, elastic wave devices (FBARs), having the lower electrode 2, piezoelectric film 3, and the upper electrode 4, are formed. A mass load film 6 is formed across the entire wafer 1 surface over the upper electrode 4. Then, the mass load film 6 is patterned into a prescribed shape by photolithography. As a result, the mass load film 6 is formed on the resonance portion of the parallel resonator.

In the present embodiment, each of the filters formed on the wafer 1 includes a serial resonator connected to a serial arm and a parallel resonator connected to the parallel arm. Furthermore, the frequency of the serial resonator is, by design, made larger than the resonance frequency of the parallel resonator. This frequency difference can be adjusted with the mass of the mass load film 6 formed on the upper electrode 4 of the parallel resonator. Furthermore, the filter bandwidth can similarly be adjusted with the mass of the mass load film 6.

Here, aluminum (Al), copper (Cu), chromium (Cr), molybdenum (Mo), tungsten (W), tantalite (Ta), platinum (Pt), ruthenium (Ru), rhodium (Rh) and iridium (Ir) may be used for the lower electrode 2 and the upper electrode 4, for example. Furthermore, aluminum nitride (AlN), zinc oxide (ZnO), lead zirconate titanate (PZT), and lead titanate (Pb-TiO3) may be used for the piezoelectric film 3, for example. Furthermore, silicon (Si), glass, ceramics, and GaAs may be used for the wafer 1 (substrate), for example.

Then, as shown in FIG. 10(c), a portion of the upper electrode 4 and the piezoelectric film 3 is removed, and the lower electrode 2 is exposed in order to expose an electrode for the input and the output. Here, after the lower electrode 2 is exposed, the sacrificial layer 5a formed beneath the lower electrode 2 is removed by etching through an etch window (not shown in the figure). As a result, the FBAR having the lower electrode 2, the piezoelectric film 3, and the upper electrode 4 (in addition, the mass load film 6 in the parallel resonator) is formed.

In the process step in FIG. 10(c), the piezoelectric film 3 preferably is over-etched in such a way that the edge of the upper electrode 4 hangs over the edge of the piezoelectric film 3. For example, when the piezoelectric film 3 is AlN, either dry etching or wet etching can be used for etching the piezoelectric film 3. When wet etching, which tends to offer an isotropic etch cross-section profile, is used, the upper electrode 4 having a shape of an overhang can be easily obtained.

Next, test terminals for a wafer probe are made to come into contact with the exposed lower electrode 2, and the resonance frequency of each FBAR is measured. For example, the difference (magnitude of shift) between a prescribed reference frequency and the resonance frequency of each FBAR is measured. As a result, the frequency distribution of the resonators on the wafer is obtained. The method of measuring the frequency distribution will be described in detail later. The frequency distribution measurements yield the across-the-wafer frequency distribution on the wafer 1, such as shown in FIG. 2, for the serial resonators and parallel resonators, respectively.

Next, as shown in FIG. 10(d), the adjusting film 7, having the patterns corresponding to this frequency distribution, is formed on the upper electrode 4. Then, as shown in FIG. 10(e), the adjusting film 7 is patterned to correspond to the magnitude of shift between the reference frequency and the resonance frequency of each FBAR. The patterning of the adjusting film 7, which corresponds to this magnitude of shift, is described above. The adjusting film 7 is deposited by a sputtering method, for example, and the prescribed shapes may be formed by a lift off or etching. The area of the adjusting film 7 at the resonance portion of each FBAR preferably is patterned to correspond to the aforementioned magnitude of shift, while the film thickness is made to be uniform across the surface of the wafer 1.

Furthermore, the adjusting film 7 may be formed to have a smaller film thickness than the thickness of the upper electrode 4 film. Then, it is possible to prevent the patterning of the adjusting film 7 from affecting the characteristics. As a result, the yield across the surface of the wafer 1 can be enhanced.

In the step shown in FIG. 10(e), the variability in the operating frequencies due to the film thickness variability across the wafer 1 can be corrected with a single step by changing the sizes of the areas of the adjusting film 7. When, for example, the adjusting film 7 is Cr, either wet etching or dry etching can be used for etching. Using the dry etching offers advantages such that the fine patterning profiles can easily be obtained, and the underetching is small.

Example of Frequency Measurements and Adjustment Process

Figure 11:
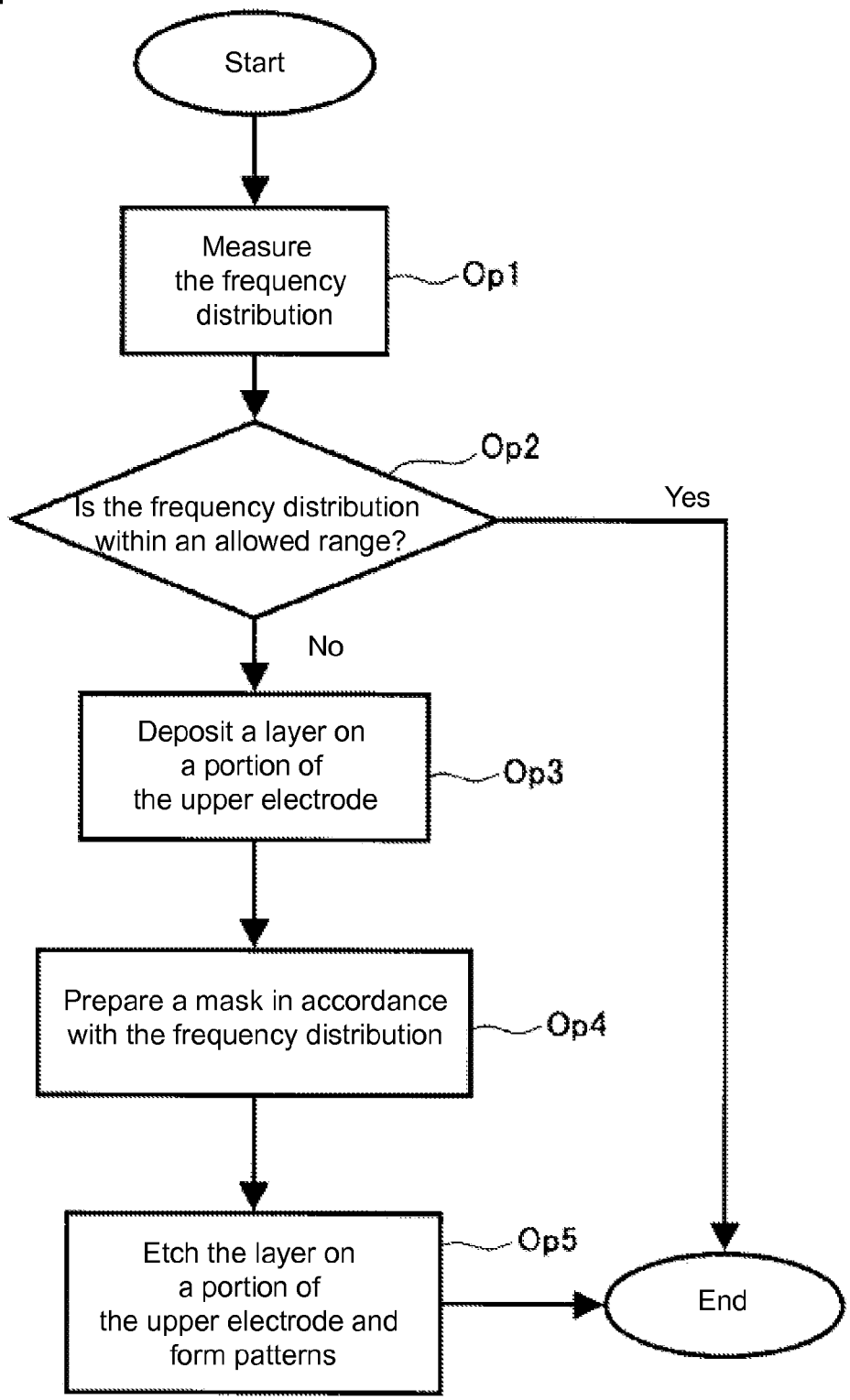
FIG. 11 is a flow chart showing an example of the frequency adjusting process.

FIG. 11 is a flow chart showing an example of a frequency adjustment process in which the frequency distribution is measured, and the adjusting film 7 is formed. In other words, the flow chart shown in FIG. 11 is one example of the process flow for the process steps shown in FIG. 10(c) and FIG. 10(d). In the example shown in FIG. 11, the frequency distribution of the FBARs on the wafer 1 is first measured (Op1). The measurement results may be obtained as data (for example, the coordinates) representing the positions on the wafer 1 and the operating frequency value (for example, resonance frequency) corresponding to each position, for example. Such measurement results may be recorded into a computer storage medium.

Next, a computer, for example, determines whether or not the measured frequency distribution falls within an allowed range (Op2). For example, the determination can be made by determining whether or not the difference between the reference frequency and the operating frequency measured at each position on the wafer 1 exceeds a threshold value.

If it is determined that the frequency distribution does not fall within the allowed range (if "no" for Op2, then, as shown in FIG. 10(d), the adjusting film 7 is deposited on the FBARs on the wafer 1. Then, the computer generates the mask data corresponding to the frequency distribution obtained from the measurement results in Op1. For example, the coverage rate of the adjusting film 7 for the FBAR at each location is calculated from the difference between the reference frequency and the operating frequency at that position. Based on the calculated coverage rate, data representing the shapes of the mask for creating the patterns, with which the resonance portion of the FBAR at each position is to be covered, is generated. The mask is thus provided (Op4).

Using the mask provided in Op4, the adjusting film 7 is etched (Op5). As a result, the adjusting film 7 is patterned in accordance with the frequency distribution on the wafer 1 (FIG. 10(e)).

This way, in forming the adjusting film 7, it is possible to make the resonance frequency of each of the FBARs close to the prescribed frequency across the wafer 1 in a single film formation step. In other words, it is possible to adjust the frequency differently at a plurality of locations on the wafer 1 in a single etching process step. It is thus possible to improve the frequency distribution across the surface. As a result, it is possible to provide the elastic wave devices (for example, the FBARs and filters) with a reduced frequency variation across the surface of the wafer 1.

Here, a program for causing the computer to execute a process for generating the design data for the mask patterns using the data on the measured frequency distribution, as shown in FIG. 11, as well as the data storage medium for recording it, are also embodiments of the present invention.

An Example of the Elastic Wave Device

Figure 12:
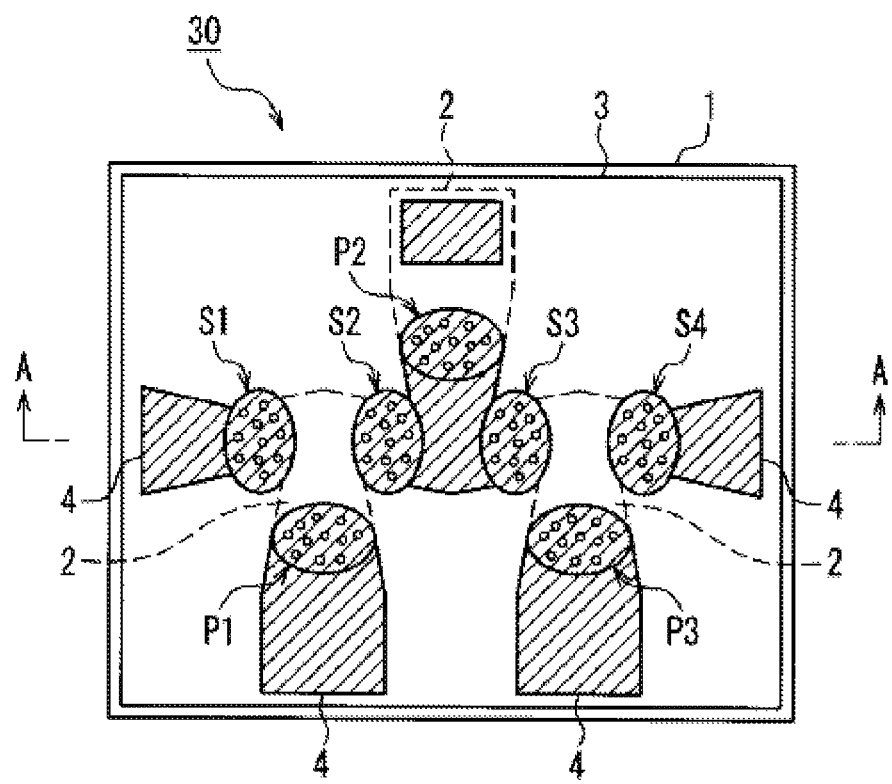
FIG. 12 is a top view drawing showing an example of a filter, which is formed on the wafer and is diced off.
Figure 13:
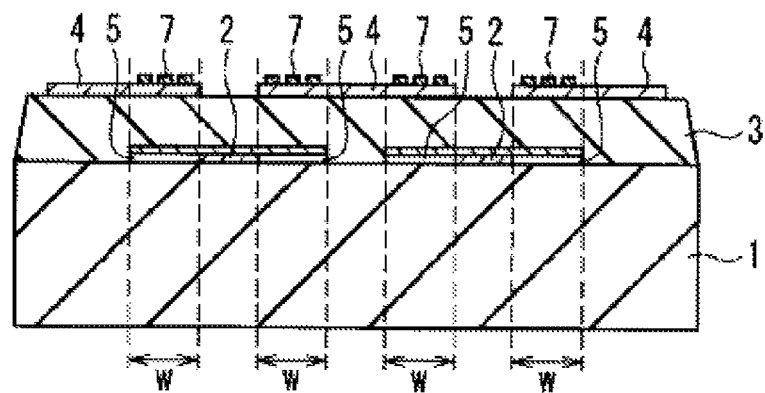
FIG. 13 is a cross-sectional drawing along the line A-A of FIG. 12.

FIG. 12 is a top view drawing showing an example of a filter, which has been formed on the wafer 1 and has been diced off. FIG. 13 is a cross-sectional diagram along the line A-A of FIG. 12. The opposing regions (for the resonance portion) W, in which the upper electrode 4 and the lower electrode 2 face opposite each other through the piezoelectric film 3 therebetween, become the serial resonators S1 through S4 and the parallel resonators P1 through P3. These seven resonators are formed atop the cavities 5.

In the aforementioned manufacturing steps, the distribution of the resonance frequency of the FBARs is measured as the operating frequencies of the elastic wave devices as an example. However, the operating frequencies of the elastic wave devices to be measured are not limited to the resonance frequencies. For example, the anti-resonance frequency of each FBAR may be measured, or the center frequency of a filter, which is constituted of the FBARs, may be measured. For example, a magnitude of shift between the filter center frequency and the prescribed center frequency (reference center frequency) may be measured in the measuring step of the frequency distribution. For example, the center frequency may be measured in each filter shown in FIG. 12.

Details on the Measuring Process

A specific example of a method of obtaining the FBAR frequency distribution on the wafer 1 is shown here. Here, as an example, monitor chips are placed on the wafer 1, and the frequency distribution is obtained by measuring frequency characteristics of the monitor chips in the method that will be described. The monitor chips are manufactured separately from the devices being shipped (actual devices).

Figure 14:
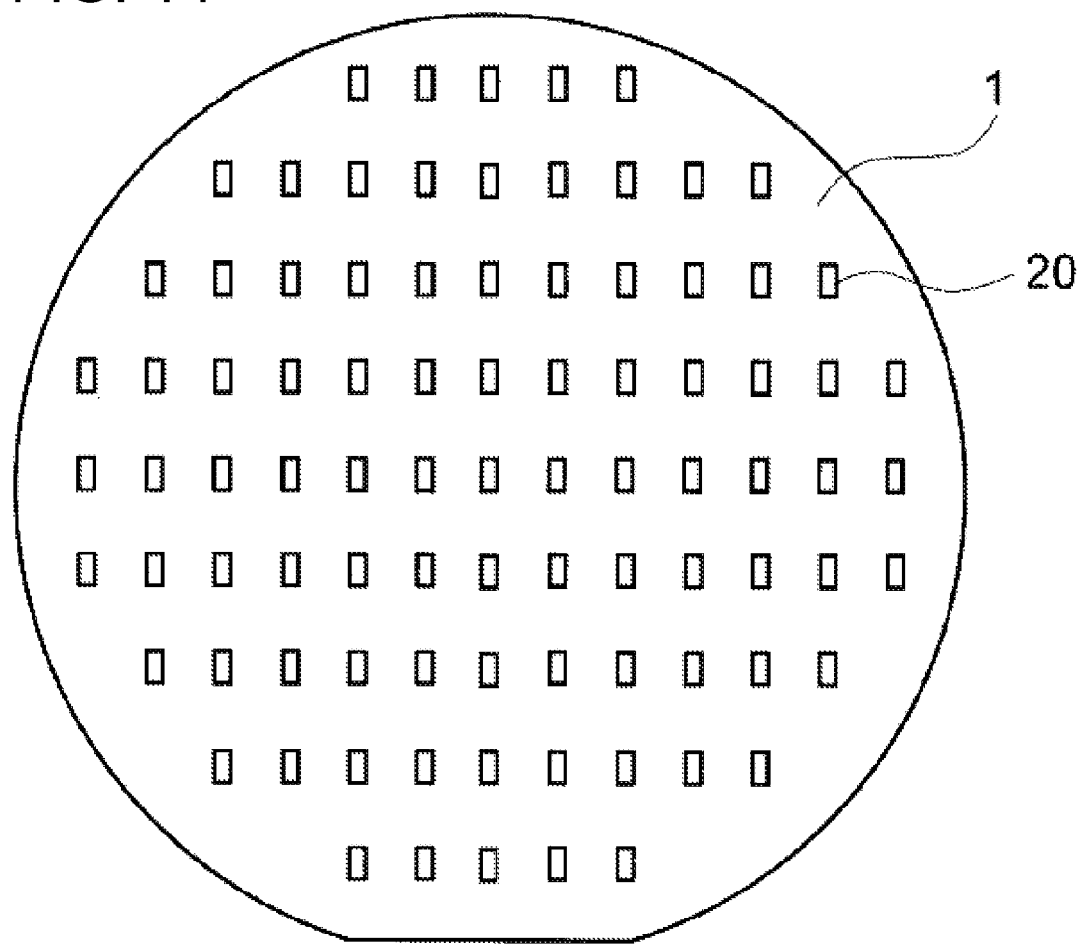
FIG. 14 is a drawing showing an example of the monitor chip layout for obtaining the frequency distribution across the wafer surface.
Figure 15:
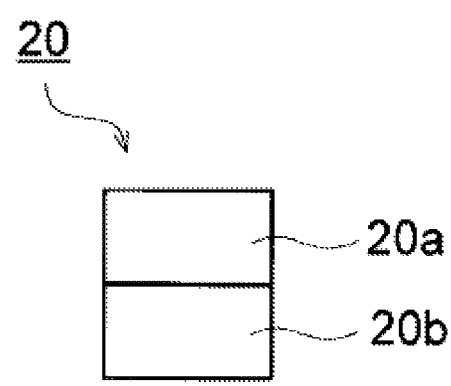
FIG. 15 is a drawing showing an example of the monitor chips 20.

FIG. 14 is a drawing showing an example of the locations of the monitor chips for obtaining the frequency distribution across the wafer. The monitor chips 20 are placed at the positions of the rectangles on the wafer 1 shown in FIG. 14. The actual devices are formed at locations other than where the aforementioned monitor chips 20 are placed. As shown in FIG. 15, a monitor chip 20 includes a monitor for the serial resonator 20a and a monitor for the parallel resonator 20b.

Figure 16:
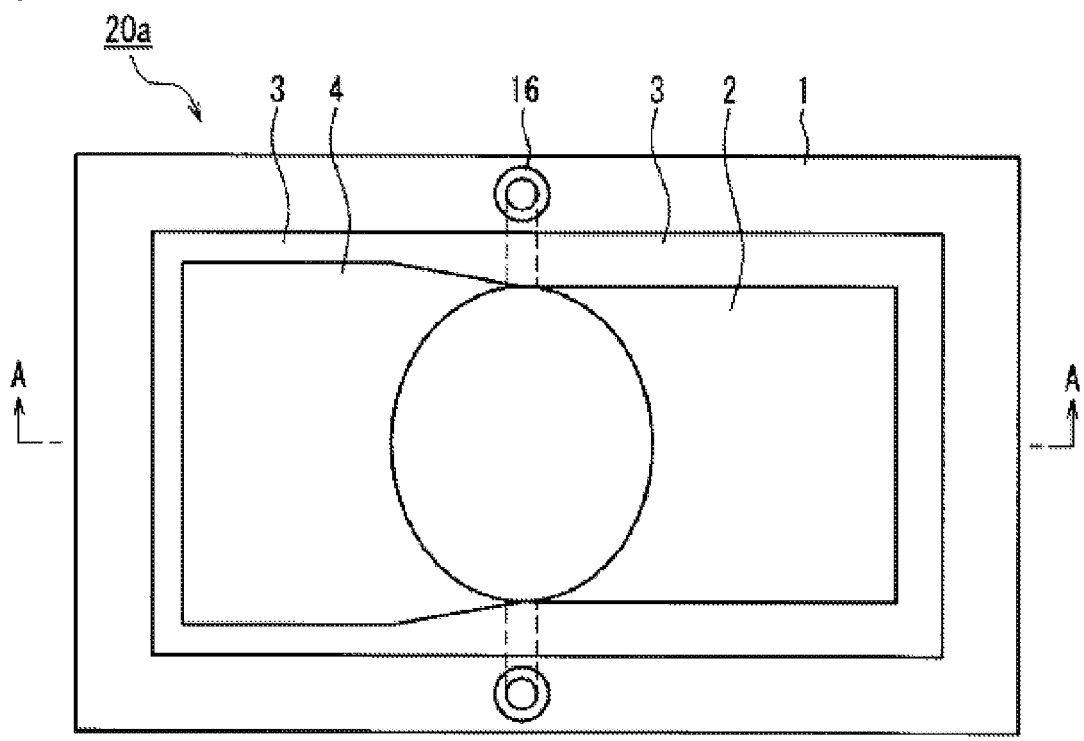
FIG. 16(a) is a top view drawing of an example of the configuration of a monitor for serial resonators.
FIG. 16(b) is a cross-sectional drawing along the line A-A of FIG. 16(a).
Figure 16:
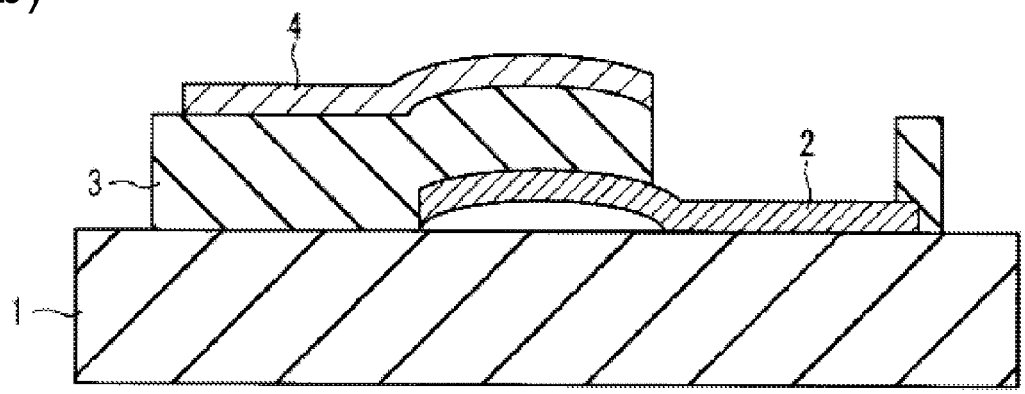
Figure 17:
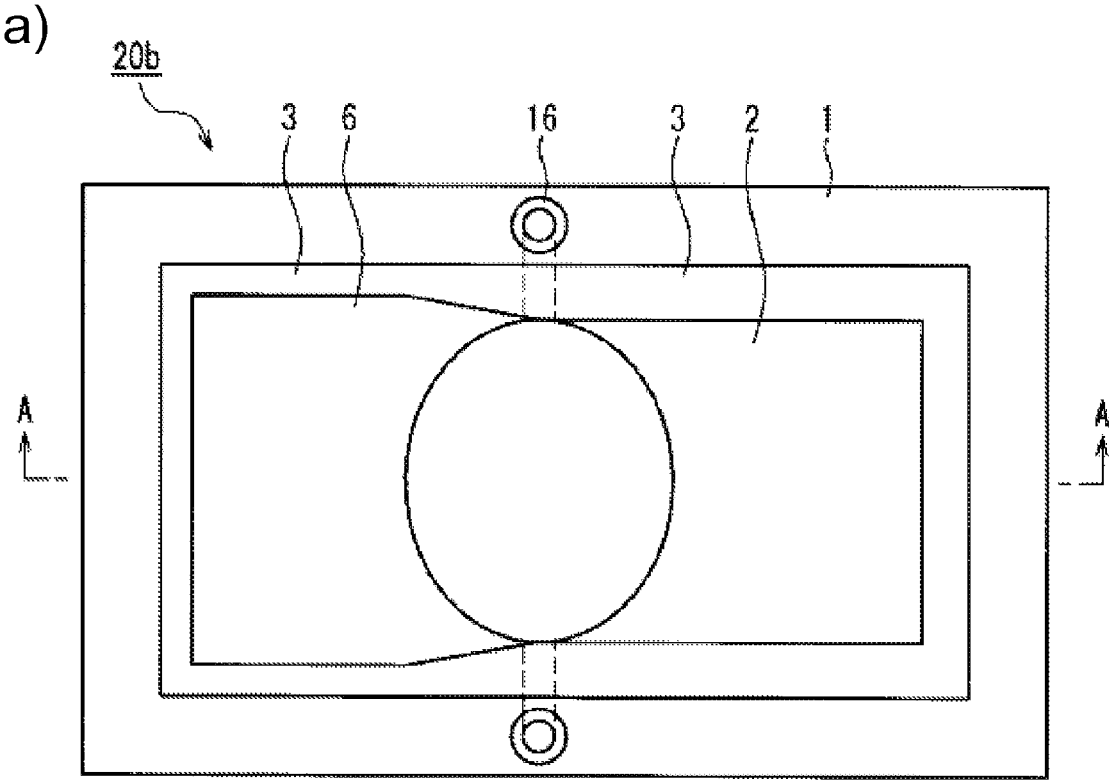
FIG. 17(a) is a top view drawing showing an example of the configuration of a monitor for parallel resonators.
FIG. 17(b) is a cross-sectional drawing along the line A-A of FIG. 17(a).
Figure 17:
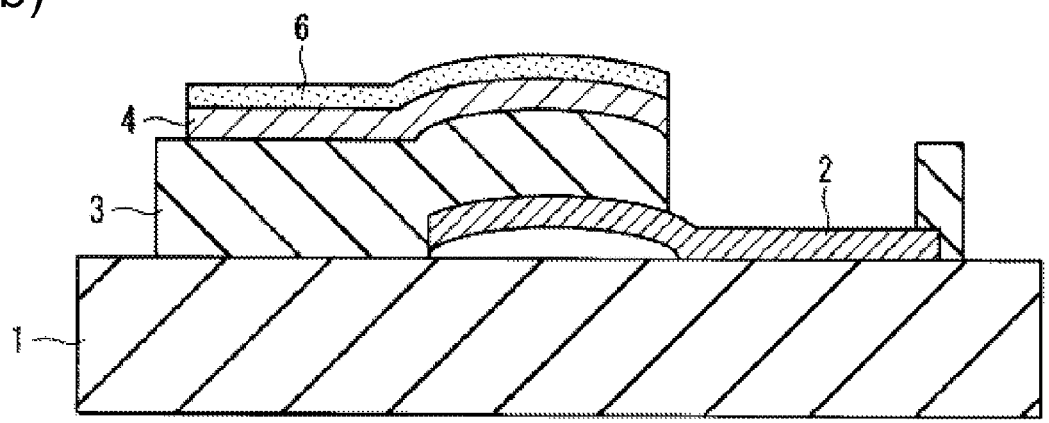

FIG. 16(a) is a top view drawing showing an example of the structure of the monitor for the serial resonator, while FIG. 16(b) is a cross-sectional drawing along the line A-A of FIG. 16(a). FIG. 17(a) is a top view drawing showing an example of the structure of the monitor for the parallel resonator, while FIG. 17(b) is a cross-sectional drawing along the line A-A of FIG. 17(a).

In the example shown in FIGS. 16(a) and 16(b), the monitor for the serial resonator 20a includes a lower electrode 2, a piezoelectric film 3, and an upper electrode 4 on the wafer 1, and a portion of the lower electrode 2 and the upper electrode 4 are exposed on the upper surface. Furthermore, an etching window 16 is provided for etching and removing a sacrificial layer 5a formed underneath the lower electrode 2. The etching window 16 opens through from the top surface of the monitor for the serial resonator 20a to a location where the sacrificial layer 5a is formed.

The monitor for the parallel resonator 20b shown in FIGS. 17(a) and 17(b) further includes a mass load film 6 formed on the upper electrode 4.

The resonance frequencies are measured by making the test terminals of a wafer probe come into contact with the exposed lower electrodes 2 of the monitor for the serial resonator 20a and of the monitor for the parallel resonator 20b.

Figure 18:
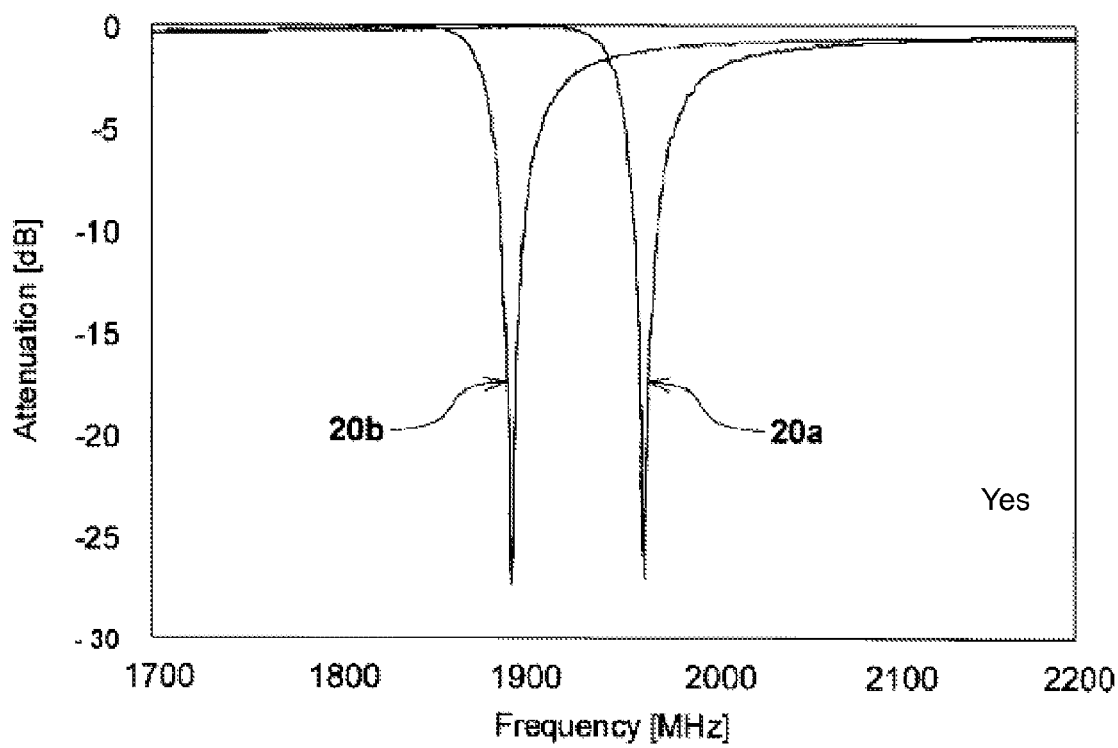
FIG. 18 is a graph showing an example of the respective frequency characteristics, measured by the monitors for the serial resonators and measured by the monitors for the parallel resonators.

FIG. 18 is a graph showing an example of the frequency characteristics measured for the monitor for the serial resonator 20a and the monitor for the parallel resonator 20b, respectively. The frequency distribution across the wafer 1, such as that shown in FIG. 2, can be obtained for the serial resonators and parallel resonators, respectively, by measuring the frequency characteristics of the monitor chips 20 placed as shown in FIG. 14.

Here, the method of obtaining the frequency distribution across the wafer is not limited to the method of directly measuring the resonance frequencies of the resonators formed on a single wafer, as mentioned above. For example, it is also possible to obtain the frequency distribution by mapping the film thickness distribution across the wafer of the lower electrodes, piezoelectric films, and upper electrodes. The film thicknesses of the lower electrodes, piezoelectric films, and upper electrodes, may, for example, be measured using an X-ray fluorescence analysis system.

Or, it is also possible to obtain the frequency variability on a target wafer based on the information on frequency variability already obtained for another wafer, when a plurality of wafers are batch processed in a mass production process.

If, as in these methods, a method of directly measuring the operating frequencies by actually operating the elastic wave devices is not to be utilized, it is possible to measure the frequency distributions and pattern the adjusting film 7 before the sacrificial layer 5a and the piezoelectric film 3 are etched, as shown in FIG. 10(c).

An Example of a Combination of Materials Having Etch Selectivity

The combination of materials for the aforementioned upper electrode 4 (or the mass load film 6) and the adjusting film 7 preferably is a combination of materials having etch selectivity. Because the adjusting film 7 patterns correspond to the frequency distribution across the wafer 1, the ratio (coverage rate) occupied by the area in which the adjusting film 7 is formed relative to the resonance portion in each FBAR tends to vary by location across the wafer 1 surface. In other words, when the adjusting film 7 is patterned, the ratio of the size of the area which will be etched relative to the resonance portion varies by location across the wafer 1 surface.

In general, the etch rate tends to vary, in some instances, according to the size of the area being etched, when the thickness of the film being etched is fairly constant. For this reason, when the adjusting film 7 is being patterned in such a way that the coverage rate varies by location on the wafer 1, there is a possibility that the etching process for the adjusting film 7 may result in damages on the layer underneath the adjusting film 7 (either the upper electrode 4 or the mass load film 6) at locations where the etch rate is higher than others.

Here, by making the combination of the adjusting film 7 and the layer beneath the adjusting film 7 (the upper electrode 4 or the mass load film 6) a combination of materials having etch selectivity, it is possible to prevent damages on the layer underneath when the adjusting film 7 is being formed.

The combination of the materials having etch selectivity is a combination of materials showing different characteristics under a prescribed etching, for example. Such a combination includes Ru/Ti, Ru/Al, Ru/Mo, Ru/W, Ru/Au, Mo/Ru, Mo/Cr, Mo/Al, Mo/Au and Mo/Pt, for example. When a material (Ru) that is etched by an $O_2$-based gas is used for the upper electrode 4, a material (for example, Al, Pt) that is etched by a $C_{12}$-based gas, or a material (for example, Mo, W, Au) that is etched by an F-based gas, for example, may be used for the adjusting film 7. When a material (for example Mo, W) that is etched by an F-based gas is used for the upper electrode 4, a material (Ru, Cr) that is etched by an $O_2$-based gas, or a material (Al, Pt) that is etched by a $C_{12}$-based gas, for example, may be used for the adjusting film 7.

Here, the materials for the upper electrode 4, mass load film 6, and for the adjusting film 7 are not limited to the aforementioned examples. For example, the adjusting film 7 may be formed of a conductive material as a portion of the upper electrode 4 or may be formed of a dielectric material.

Examples of Other Configurations

Electrode Structure

At least one of the lower electrode 2 and the upper electrode 4 may have a laminated structure which includes two or more layers of film. For example, the upper electrode 4 may have a double layer structure, and one of these two layers may be the adjusting film 7. For example, the lower electrode 2 may be a double layer of Ru and Cr, while the upper electrode 4 may be formed of a double layer film of Cr and Ru. Each film is formed using, for example, a sputtering method. For example, in the case that the FBAR has a resonance frequency of 2 GHz, the film thickness of each layer may be approximately Ru (250 nm)/Cr (100 nm) for the lower electrode 2, AlN (1150 nm) for the piezoelectric film 3, and Cr (20 nm)/Ru (250 nm) for the upper electrode 4.

Here, for example, the Cr layer, which is a portion of the upper electrode 4 (Cr/Ru) having a laminated structure, may be the adjusting film 7. In such an instance, the Cr layer of the upper electrode 4 is subjected to a photolithography process and patterned into sizes of areas corresponding to the frequency distribution on the wafer 1. The Cr layer is formed into the island-shaped pattern shown in FIG. 3 through FIG. 6, for example. Here, the number of layers in the upper electrode 4 may also be three layers or more.

Additional Frequency Adjusting Film

A frequency adjusting film covering a region including the resonance portion, where the lower electrode 2 and the upper electrode 4 face opposite each other, may additionally be formed in each of the FBAR on the wafer 1. Then, it is possible to shift the operating frequencies of the elastic wave devices on the wafer 1 toward a lower frequency while retaining the reduced frequency distribution variability, after the across-the-wafer frequency variability has been reduced by forming the adjusting film 7 in accordance with the frequency distribution across the wafer surface. As a result, elastic wave devices with high yields can be provided.

This frequency adjusting film may be an insulating film, such as a metal oxide film or a metal nitride film. Then, the surface of the upper electrode 4 can be protected.

Mass Load Film

Furthermore, the mass load film 6 may also be a conductive film. Then, it is possible to prevent the characteristics from being affected b the patterning of the adjusting film 7 on the mass load film 6 and to improve the yields across the wafer surface.

Dome-Shaped Cavity

The cavity 5 between the underside of the lower electrode 2 and the substrate (wafer) 1, shown in FIG. 3, may also be formed as a space with a dome-shaped surface. In other words, the outline of the cavity 5 in the FBAR cross-sectional diagram shown in FIG. 3 may be a shape that includes a curved line. For example, it is possible to stack the laminated body (compound film), which includes the lower electrode 2, piezoelectric film 3, and upper electrode 4, in the step shown in FIG. 10(b) with deposition conditions that result in a compressive stress in these layers. As a result, the compound film bows and protrudes upward to form a dome shaped cavity 5 between the lower electrode 2 and the substrate (wafer) 1 when the etching of the sacrificial layer 5a is completed in the step shown in FIG. 10(c). For example, the compressive force in the compound film may be in a range of −300 MPa to −150 MPa.

Here, the cavity 5 need not be formed by an air-bridge method as in the present example and may be formed by a processing of the substrate surface, where a hole is opened underneath the resonance portion in the substrate to create a void, for example. Furthermore, a void which penetrates through the substrate can be formed.

An Example of a Module Using the Elastic Wave Device

Figure 19:
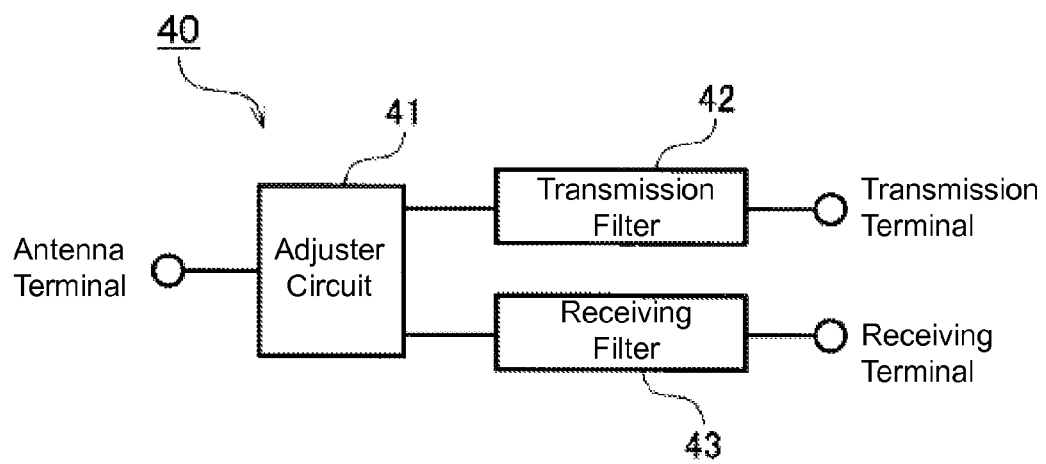
FIG. 19 is a schematic drawing showing an example of the structure of a wave splitter, which is an example of the present embodiment.

Embodiments of the present invention include modules and communications systems using the elastic wave devices manufactured as described above. For example, a wave splitter with two filters shown in FIG. 12 connected in parallel is an example of such a module. FIG. 19 is a schematic drawing showing the structure of such a wave splitter 40. A wave splitter 40 shown in FIG. 19 includes a transmitter filter 42 placed between an antenna terminal and a transmitter terminal, and a receiving filter 43 placed between the antenna terminal and a receiving terminal. An adjuster circuit (for example, a phase shifter) 41 may be added as needed, for an impedance adjustment between the antenna terminal and each of the filters. The function of the wave splitter 40 is to isolate the received signals from the transmitted signals. For example, it is used directly underneath an antenna in a mobile phone based on the CDMA system.

The FBARs that are manufactured with the manufacturing method disclosed as in the aforementioned embodiments may be used for the transmission filter 42 and the receiving filter 43 in the wave splitter 40. Furthermore, it is also possible to form a plurality of wave splitters 40 on a single substrate by the manufacturing method disclosed in the aforementioned embodiments. A communications system using the module, such as the example of the aforementioned wave splitter 40, is also included among the embodiments of the present invention.

Effects of the Present Embodiments

In the aforementioned embodiments, the frequencies are adjusted by controlling the volumes of the resonance portions of the elastic wave devices. It is possible to adjust the volumes of the adjusting films, i.e., the amounts of adjustments on the frequencies, in accordance with the frequency distribution across the wafer surface by adjusting the sizes of the areas of the adjusting films in accordance with the frequency distribution across the wafer. In other words, frequency adjustments corresponding to the frequency distribution across the wafer are realized by the adjusting films having patterns corresponding to the across-the-wafer frequency distribution.

In other words, by achieving a distribution of the area sizes in accordance with the distribution of frequencies across the surface, while maintaining a constant adjusting film thickness, it is possible to adjust the volumes of the adjusting films, i.e., the amounts of frequency adjustments, in a distributed manner across the surface. As a result, it is possible to achieve varying frequency shift adjustments at a plurality of locations across the wafer surface by patterning the adjusting film, which is a process including a single film deposition and etching. For this reason, it is possible to create elastic wave devices with a smaller across-the-surface variation in frequencies with a fewer process steps, as compared with conventional adjusting methods with a plurality of film depositions and etchings.

Furthermore, by using a layer that is a portion of the upper electrode as the adjusting film, it is possible to adjust the frequencies while preventing a large increase in the wiring resistance in the upper electrode. For example, in case of the method in which the frequencies are shifted through a formation in the upper electrode of holes with a depth comparable to the film thickness of the upper electrode, there is a concern that the resistance in the upper wiring lines may increase significantly. In contrast, there is no concern of an increased wiring resistance with the aforementioned embodiment, because the frequencies are adjusted using a partial layer of the upper electrode as the adjusting film.

While the adjusting regions are formed by the formation of the adjusting film on the upper electrode in the present embodiments, the method of forming the adjusting regions are not limited to this. For example, the adjusting region may be formed with a portion of the upper electrode shaved off to make it thinner than the other portions. The thickness of the resonance portion in the adjusting region simply need to be different from that in other portions.

Furthermore, it is possible to obtain the similar effects, when an SMR is formed, instead of the FBAR, in the aforementioned embodiments. Furthermore, while the frequency adjustments are made in the present embodiments for the purpose of suppressing the frequency variation across the wafer, it is also possible to adjust the frequencies of a plurality of elastic wave devices on a single substrate using the aforementioned method for other purposes.

The invention claimed is:

1. A method of manufacturing an elastic wave device comprising:
   a laminating step of forming on a substrate a plurality of the elastic wave devices, which are ladder type filters each including a serial resonator and a parallel resonator, each of the serial and parallel resonators including a lower electrode, a piezoelectric film formed over said lower electrode, and an upper electrode formed at a position facing the lower electrode through said piezoelectric film therebetween, each parallel resonator including a mass load film formed over said upper electrode, and the mass load film being absent in the serial resonators;
   a measuring step of measuring a distribution of operating frequencies of the plurality of elastic wave devices on said substrate, a region where said lower electrode and said upper electrode face each other through the piezoelectric film therebetween functioning as a resonance portion; and
   an adjusting step of forming, at said resonance portion of respective serial and parallel resonators, an adjusting region in which the thickness of said resonator differs from other portions of the resonance portion, in accordance with the distribution of said operating frequencies,
   wherein said adjusting region is formed in said adjusting step such that the size of the area of said adjusting region in said resonance portion varies in accordance with said measured distribution of said operating frequencies, and
   wherein said adjusting region is formed of an adjusting film formed on at least a portion of said upper electrode or said mass load film, the adjusting film having island-shaped patterns disposed randomly.

2. The method of manufacturing the elastic wave devices according to claim 1, wherein the sizes of the areas of the adjusting films are varied so that a respective coverage rate of the adjusting film in said resonance portion is varied in accordance with the distribution of said operating frequencies.

3. The method of manufacturing the elastic wave devices according to claim 1, wherein center frequencies of the plurality of elastic wave devices on said substrate are measured in said measuring step, and the size of the area of said adjusting region in each of the elastic wave devices is determined in said adjusting step based on a difference between the said measured center frequency of each of the plurality of elastic wave devices and a target center frequency determined in advance.

4. The method of manufacturing the elastic wave devices according to claim 1, wherein said adjusting film is formed with the same thickness among the plurality of elastic wave devices.

5. The method of manufacturing the elastic wave devices according to claim 1, wherein the material for said adjusting film and the material for a layer underneath said adjusting film react differently to etching.

6. The elastic wave devices according to claim 1, wherein a plurality of chips including said plurality of elastic wave devices are formed in said laminating step by the formation of the plurality of elastic wave devices on said substrate, and said adjusting region is formed in said adjusting step so that the size of the area of said adjusting region on said resonance portion on the plurality of elastic wave devices varies across at least some of the plurality of chips in accordance with said measured distribution of said operating frequencies.

7. A method of manufacturing a plurality of elastic wave devices on a substrate, the method comprising:
   forming on the substrate a plurality of the elastic wave devices, which includes ladder type filters each including a serial resonator and a parallel resonator, each of the serial and parallel resonators including a lower electrode, a piezoelectric film formed over said lower electrode, an upper electrode formed over the piezoelectric film, each parallel resonator including a mass load film formed over said upper electrode, and the mass load film being absent in the serial resonators;
   measuring a variation of operating characteristics of the plurality of elastic wave devices across said substrate; and
   forming an adjusting film in at least some of the plurality of elastic wave devices,
   wherein the thickness of said adjusting film is substantially constant among the at least some of the plurality of elastic wave devices, and the size of an area of said adjusting film is adjusted across the substrate in accordance with said measured variation in operating characteristics so as to offset the variation in operating characteristics, thereby yielding substantially uniform operating characteristics across the substrate or across at least some regions of the substrate, and
   wherein said adjusting film is formed on at least a portion of said upper electrode or said mass load film in said at least some of the plurality of elastic wave devices, the adjusting film having island-shaped patterns disposed randomly.

8. The method of manufacturing a plurality of elastic wave devices according to claim 7, wherein the sizes of the areas of said adjusting film is varied so that a respective coverage rate of the adjusting film within a resonance portion of the elastic wave device is varied in accordance with the variation in operating characteristics.

9. A plurality of elastic wave devices comprising:
   a substrate; and
   a plurality of serial resonators and a plurality of parallel resonators, each of the serial resonators and the parallel resonators including
   a lower electrode formed over said substrate;
   a piezoelectric film formed over said lower electrodes; and
   an upper electrode formed at a position facing said lower electrodes through said piezoelectric films therebetween,
   wherein said parallel resonator further includes a mass load film formed over the upper electrode, and the mass load film is absent in the serial resonators,
   wherein, at a resonance portion of the respective serial and parallel resonators where the lower electrode faces said upper electrode through said piezoelectric film therebetween, an adjusting region, in which the thickness of the serial or parallel resonator is different from other portions of the resonance portion, is formed, and the sizes of areas of said adjusting regions in said resonance portions are adjusted to offset a variation in operating characteristics among a plurality of elastic wave devices on said substrate, and
   wherein said adjusting region is formed of an adjusting film formed on at least a portion of said upper electrode or said mass load film, the adjusting film having island-shaped patterns disposed randomly.

10. The elastic wave devices according to claim 9, wherein the plurality of elastic wave devices on said substrate make up a plurality of chips, and the sizes of areas of said adjusting regions in said resonance portions of the plurality of elastic wave devices vary by chip.

11. The elastic wave devices according to claim 9, wherein said adjusting film has the same thickness among the plurality of elastic wave devices.

12. The elastic wave devices according to claim 9, wherein the sizes of the areas of the adjusting films are varied so that a respective coverage rate of the adjusting films in said resonance portions is varied in accordance with the variation in operating characteristics among the plurality of elastic wave devices on said substrate.

13. The elastic wave devices according to claim 9, said island-shaped patterns to be disposed across the entire resonance portion.

14. The elastic wave devices according to claim 9, the material for said adjusting film and the material for a layer beneath said adjusting film react differently to etching.

15. A device substrate, comprising:
   a substrate;
   a plurality of elastic wave devices on the substrate, which are ladder type filters each including a serial resonator and a parallel resonator, each of the serial and parallel resonators comprising:
   the substrate,
   a lower electrode formed over said substrate,
   a piezoelectric film formed over said lower electrodes,
   an upper electrode formed over said piezoelectric film, and
   a mass load film formed over said upper electrode of said parallel resonator, the mass load film being absent in the serial resonators; and
   an adjusting film formed in at least some of the plurality of elastic wave devices,
   wherein the thickness of said adjusting film is substantially constant among the at least some of the plurality of elastic wave devices, and the size of an area of said adjusting film is adjusted across the substrate so as to offset a variation in operating characteristics of the plurality of elastic wave devices across the substrate, thereby yielding substantially uniform operating characteristics across the substrate or across at least some regions of the substrate, and
   wherein said adjusting film is formed on at least a portion of said upper electrode or said mass load film in said at least some of the plurality of elastic wave devices, the adjusting film having island-shaped patterns disposed randomly.

16. The device substrate according to claim 15, wherein the sizes of the areas of said adjusting films are varied so that a respective coverage rate of the adjusting film in a resonance portion of the elastic wave device is varied in accordance with the variation in the operating characteristics of the plurality of elastic wave devices across the substrate.

* * * * *